United States Patent [19]

Kadija et al.

[11] Patent Number: 4,749,626

[45] Date of Patent: Jun. 7, 1988

[54] WHISKER RESISTANT TIN COATINGS AND BATHS AND METHODS FOR MAKING SUCH COATINGS

[75] Inventors: Igor V. Kadija, Cheshire; Julius C. Fister, Hamden; Joseph Winter, New Haven; Arvind Parthasarathi, Hamden, all of Conn.

[73] Assignee: Olin Corporation, New Haven, Conn.

[21] Appl. No.: 879,118

[22] Filed: Jul. 3, 1986

Related U.S. Application Data

[63] Continuation-in-part of Ser. No. 762,177, Aug. 5, 1985, abandoned.

[51] Int. Cl.$^4$ .................. C25D 3/60; B32B 15/01
[52] U.S. Cl. .................... 428/647; 106/1.22; 106/1.23; 106/1.24; 204/44.4; 420/557; 427/436; 427/437; 428/646; 428/648
[58] Field of Search ............... 420/557; 428/646, 647, 428/648; 204/44.6, 44.4; 106/1.15, 1.19, 1.23, 1.24, 1.28, 1.21, 1.22; 427/436, 437

[56] References Cited

U.S. PATENT DOCUMENTS

| | | | |
|---|---|---|---|
| 1,565,115 | 12/1925 | Speed et al. | 420/557 |
| 1,905,105 | 4/1933 | Kersten | 204/44.3 |
| 2,259,270 | 10/1941 | Ryder et al. | 204/43.1 |
| 3,532,518 | 10/1970 | D'Ottavio | 106/1 |
| 3,663,384 | 5/1972 | Lescure | 204/44.4 |
| 3,956,123 | 5/1976 | Rosenberg et al. | 204/44.4 |
| 3,966,564 | 6/1976 | Hyner et al. | 204/44.4 |
| 4,029,556 | 6/1977 | Monaco et al. | 204/40 |
| 4,049,508 | 7/1977 | Morrissey | 204/44.4 |
| 4,093,466 | 6/1978 | Davis | 106/1.22 |
| 4,162,205 | 7/1979 | Wilson et al. | 204/44.4 |
| 4,168,223 | 9/1979 | Igarashi et al. | 204/44.4 |
| 4,194,913 | 3/1980 | Davis | 106/1.22 |
| 4,207,143 | 6/1980 | Glomb et al. | 162/207 |
| 4,207,148 | 6/1980 | Hsu | 204/44.4 |
| 4,263,106 | 4/1981 | Kohl | 204/44.4 |
| 4,331,518 | 5/1982 | Wilson | 204/44.4 |
| 4,347,107 | 8/1982 | Teichmann et al. | 204/44 |

FOREIGN PATENT DOCUMENTS

| | | | |
|---|---|---|---|
| 128947 | 10/1979 | Japan | 204/44.4 |
| 113894 | 9/1980 | Japan | 204/44.4 |
| 65993 | 6/1981 | Japan | 204/44.4 |
| 934189 | 8/1963 | United Kingdom . | |
| 1106708 | 3/1968 | United Kingdom . | |
| 1167138 | 10/1969 | United Kingdom | 204/54 R |
| 1396540 | 6/1975 | United Kingdom . | |
| 1468580 | 3/1977 | United Kingdom . | |
| 1497522 | 1/1978 | United Kingdom . | |
| 1573241 | 8/1980 | United Kingdom . | |
| 1583923 | 2/1981 | United Kingdom . | |
| 2094349A | 9/1982 | United Kingdom . | |
| 187476 | 11/1966 | U.S.S.R. | 204/44.4 |
| 196509 | 6/1967 | U.S.S.R. . | |

OTHER PUBLICATIONS

Ukr. Khim Zh, 46(8), 1980, A. V. Gorodyskii et al., "Electrochemical Reduction of Truzlent Vidium and Vutherium Against a background of Sulfelts in the Presence of Tin and Cadmium Irons", pp. 787–790, (Chemical Abstracts 93 175893r).

J. Electroanal. Chem. Interfacial Electrochem, 70(1), 1976 D. F. A. Koch et al., Binary Electrocatalysts for Organic Oxidations, pp. 73–86 (Chemical Abstracts 85 180035b).

G. W. Gavanaugh et al., Plating pp. 369–371, Apr. 1970.
S. M. Arnold, Plating, pp. 96–99. Jan. 1966.
"Spontaneous Growth of Whiskers on Tin Coatings: 20 Years of Observation" by S. C. Britton, Transactions of the Institute of Metal Finishing, vol. 52, 1974, pp. 95–102.

Primary Examiner—G. L. Kaplan
Attorney, Agent, or Firm—Gregory S. Rosenblatt; Paul Weinstein

[57] ABSTRACT

The present invention relates to an addition to tin coating solutions for inhibiting the growth of tin whiskers. The addition comprises a concentration of a metal salt selected from the group consisting of palladium salt, silver salt, nickel salt, iron salt, cadmium salt, platinum salt, gold salt, indium salt, ruthenium salt and cobalt salt. In a preferred embodiment, the metal salt addition is either a palladium salt such as palladium chloride or a silver salt such as silver sulfate.

18 Claims, No Drawings

WHISKER RESISTANT TIN COATINGS AND BATHS AND METHODS FOR MAKING SUCH COATINGS

This application is a continuation-in-part of U.S. patent application Ser. No. 762,177, filed Aug. 5, 1985, to Kadija et al, now abandoned.

The present invention relates to coating metal or metal alloy substrate materials with tin or a tin containing material. The present invention has particular utility in applying a tin coating to copper and copper base alloy substrates such as circuit foil for use in electrical and electronic applications.

Coating components with tin or a tin containing material has become increasingly important in fabricating electronic circuits, electronic devices and electrical connectors because of the many desirable benefits it provides. For example, tin coating metal and metal alloy components helps protect the components from corrosion. Tin coating also helps provide a chemically stable surface for soldering and helps maintain good surface electrical contact.

Tin coatings may be applied to metallic substrates using a variety of plating solutions and methods. For example, a tin coating may be formed by immersing an article to be coated in a tin containing solution. Alternatively, tin coatings may be formed by electrodepositing a tin layer on a substrate or by electrolessly plating the tin coating on the substrate. U.S. Pat. Nos. 3,966,564 to Hyner et al, and 4,049,508 to Morrissey, Japan Patent Publication No. 55-113894, Russian Patent No. 187,746, and the article "Tin-Lead Electrodeposits: The Effect of Impurities in the Solution," by G. W. Cavanaugh et al., *Plating,* April 1970, pp. 369-371 illustrate some of the techniques for forming tin coatings on metallic substrates. U.S. Pat. Nos. 3,663,384 to Lescure, 3,956,123 to Rosenberg et al., 4,029,556 to Monaco et al., 4,162,205 to Wilson et al., 4,168,223 to Igarashi, 4,207,148 to Hsu and 4,347,107 to Teichmann et al. and Japanese Patent Publication Nos. 54-128947 and 56-65993 illustrate a variety of solutions for forming tin containing coatings.

Regardless of the coating technique employed, it is desirable to form smooth and level deposits of tin on the substrate in order to minimize porosity. It is also desirable to form a coating having a relatively constant thickness. A relatively constant coating thickness is important in reducing etching problems—particularly where close tolerances are involved.

There are, however, several negative aspects that typically must be overcome to effectively utilize tin coatings, particularly those applied to copper and copper base alloy substrates. Tin, when laid down on a copper base substrate, suffers from interdiffusion and formation of copper-tin compounds. These copper-tin compounds can be brittle and may impair the usefulness of the tin coated component. The presence of copper-tin compounds can also adversely affect subsequent soldering operations. High purity tin is often used as the coating material to overcome these problems. However, this solution is not without its own problems. Metal filaments known as tin whiskers sometimes grow spontaneously from these tin coatings. With the very fine line definition required for modern circuitry, these filaments can form both electrical shorts and electrical bridges across insulation spaces between conductors.

The mechanics of the tin whisker problem are not clearly understood. The filaments may begin to grow within days of the application of the coating or several years thereafter. There is speculation in the literature that the whiskers grow from stress concentration sites, such as those created in many electrodeposition techniques, as tin extrusions which are dendritic in nature. There is also speculation that temperature and humidity affect whisker growth. The article "Simultaneous Growth of Whiskers on Tin Coatings: 20 Years of Observation," by S. C. Britton, *Transactions of the Institute of Metal Finishing,* Volume 52, 1974, pp. 95-102 discusses the tin whisker growth problem and offers several recommendations for reducing the risk of whisker formation.

One approach for handling the tin whisker problem has been to specify short storage times for tin coated materials. However, this approach does not fully address or necessarily avoid the problem. Another approach has been to mildly strengthen the tin matrix to prevent extrusion of the whiskers. The formation of an intermetallic compound and diffusion of solute copper into the tin plate have served this purpose but at prohibitive performance cost in the final product.

Other approaches for dealing with this problem have generally involved a whisker inhibiting addition to the tin coating solution. One such approach involves the incorporation of a soluble plumbous salt and a sulphur containing complexing agent such as thiourea or a thioureatype derivative into an immersion plating tin bath composition. U.S. Pat. Nos. 4,093,466 and 4,194,913, both to Davis, illustrate this approach. Another approach involves forming a coating by electroplating tin, lead or alloys of tin and lead from aqueous acidic baths containing one or more additives selected from a class of organic compounds including lactones, lactams, cyclic sulfate esters, cyclic imides and cyclic oxazolinones. U.S. Pat. No. 4,263,106 to Kohl illustrates this approach to the problem. Yet another approach involves using an acidic electroplating bath containing tin ions and a chelate salt comprising an acid bismuth sulfate gluconate. U.S. Pat. No. 4,331,518 to Wilson illustrates this approach to the problem.

Two other approaches for dealing with the problem of tin whiskers are illustrated in U.K. Patent No. 1,167,138 and in the article "Repressing the Growth of Tin Whiskers," by S. M. Arnold, *Plating,* January 1966, pp. 96-99. It is suggested in U.K. Patent No. 1,167,138 that the growth of tin whiskers may be prevented by reducing the amount of hydrogen absorbed or occluded in the structure of the plating metal. Ultrasonic agitation of the plating solution and/or alternating the polarity of the electrodes during plating are used to reduce the amount of hydrogen. Arnold identifies a number of metals including antimony, cobalt, copper, germanium, gold, lead and nickel which when present in the coating in an amount in the range of 1%-2% appear to reduce the growth of tin whiskers.

While these approaches have been available for some time, there are those that believe an effective solution to the tin whisker problem is still needed.

Accordingly, it is an object of the present invention to provide an effective approach for inhibiting the growth of tin whiskers on tin coated substrates.

It is a further object of the present invention to provide an approach as above for inhibiting the growth of tin whiskers from tin and tin-containing coatings without adversely affecting the solderability or reflow capability of the coating.

It is yet a further object of the present invention to provide an approach as above in which a metal salt addition is made to a tin coating solution to inhibit the formation of tin whiskers.

These and other objects and advantages will become more apparent from the following description.

In accordance with the present invention, the growth of tin whiskers from tin or tin-containing coatings is inhibited by the addition of a metal salt to the tin containing solution from which the coating is formed. One of the advantages of the present invention is that it may be used with a wide variety of standard tin coating solutions. Another advantage is that the growth of tin whiskers may be inhibited without reducing the quality of the coatings. In fact, high quality coatings may be produced using the solutions of the present invention. Metal salt additions which have been found to have particular utility include those of palladium, e.g. palladium chloride, and those of silver, e.g. silver sulfate. Other salts which may be used include salts of nickel, cadmium, cobalt, iron, platinum, gold, indium and ruthenium.

In a first embodiment of the present invention, tin coating solutions for imparting whisker formation resistance may be prepared by first adding one of the aforementioned metal salts to an initial or base tin containing solution. As previously mentioned, there are a wide variety of standard tin coating solutions that may be used as the base solution. In this first approach, the metal salt is added to the base solution in a concentration above the saturation point of the solution. This forms a metal salt saturated tin containing solution. This saturated tin containing solution is then diluted by adding it to a second quantity of the base solution. This diluted solution forms the tin coating solution used to apply the tin or tin containing coating to the substrate material.

In a second embodiment of the present invention, the tin coating solution is prepared by adding a quantity of hydrochloric acid to a base tin containing solution. A metal salt to be added to the base solution is also first added to a quantity of hydrochloric acid. The metal salt—hydrochloric acid solution is then slowly added to the base solution to form the tin containing solution to be applied to the substrate material.

When a palladium salt addition is used to provide whisker resistance, the palladium should be present in the tin coating solution in a concentration in the range of from about 5 ppm to about 10,000 ppm, preferably from about 20 ppm to about 1000 ppm. Some useful coating solutions contain palladium in a concentration in the range of from about 50 ppm to about 1000 ppm. When a silver salt addition is used to provide whisker resistance, the silver should be present in the tin coating solution in a concentration in the range of from about 50 ppm to about 50,000 ppm, preferably from about 500 ppm to about 5000 ppm.

Another advantage of the present invention is that any suitable application technique known in the art including electroless plating, electrodeposition and immersion may be used to form the whisker resistant tin coating on the substrate material. Still another advantage is the ability to form relatively fine, relatively smooth, high quality coatings having excellent solderability properties.

As previously mentioned, the present invention broadly relates to the discovery that the formation of tin whiskers from tin and tin containings coatings may be inhibited by making a metal salt addition to the bath solution from which the coating is formed. In practice, there are a wide variety of tin coating solutions which may be used as a base solution to which the metal salt is added. Suitable base solutions may contain sodium stannate, tin fluoroborate, tin pyrophosphate, tin sulfate, and/or tin chloride. Of course, the concentration of the tin salts in these base solutions may vary over a large range. If desired, the base solution may contain a soluble lead compound or a silver compound in a desired concentration. When such compounds are added to the tin solution, a tin-lead or a tin-silver coating is formed on the substrate. It has been discovered that for applications which require soldering or reflow of the coating, the base solution as well as the coating solution should be zinc-free.

It has been found that particularly useful tin containing base plating solutions include solutions designated TIN-POSIT and LT-26 and sold by Shipley. LT-26 is an aqueous solution containing 20 grams/liter, hereinafter g/l, stannous chloride, 16 g/l sodium hypochlorite, 75 g/l thiourea and 1 g/l of a wetting agent. Up to 75 ml/liter of hydrochloric acid may be added to LT-26 to form the base plating solution. The base solution may be prepared in any desired manner.

To form the coating solutions of the present invention, a metal salt selected from the group consisting of palladium, silver, nickel, cadmium, cobalt, iron, platinum, gold, indium and ruthenium salts is added to a suitable tin-containing base solution. In one embodiment of the present invention, the metal salt is added to the tin-containing solution in an amount sufficient to exceed the saturation point of the base solution This forms a metal salt saturated tin containing solution. One can tell when the saturation point of the base solution has been exceeded, when one sees the metal salt addition on the bottom of the base solution. Preferably, a palladium salt such as palladium chloride or a silver salt such as silver sulfate is added to the base solution to form the saturated solution. When one uses palladium chloride as the addition, approximately 1 g/l of palladium chloride should be sufficient to exceed the saturation point. When a silver salt is used for the addition, the silver salt may be initially prepared by dissolution and saturation in water.

In this first approach, the solution from which the coating is to be formed is prepared by diluting the saturated base solution in another quantity of the base solution. In diluting the saturated solution, one must keep in mind that a certain metal salt level is needed in the final coating solution to impart the desired resistance to tin whisker formation to the coating. When a palladium salt addition is used, the palladium concentration in the final coating solution should be in the range of from about 5 ppm to about 10,000 ppm, preferably from about 20 ppm to about 1000 ppm. Some useful coating solutions contain palladium in a concentration from about 50 ppm to about 1000 ppm. When a silver salt addition is used, the silver concentration in the final coating solution should be in the range of from about 50 ppm to about 50,000 ppm, preferably from about 500 ppm to about 5000 ppm. When others of the aforementioned metal salts are used, the particular metal in the salt should be present in the final coating solution in a concentration in the range of from about 10 ppm to about 50,000 ppm, preferably from about 50 ppm to about 5,000 ppm.

In another embodiment of the present invention, the tin coating solution is prepared by adding hydrochloric acid to an aqueous tin-containing base solution such as a solution produced by Shipley and designated LT-26. When LT-26 is used as the base solution, up to 75 ml of hydrochloric acid per liter of base solution may be added. The metal salt to be added to the solution to impart whisker resistance to the coating is first dissolved in an aqueous hydrochloric acid solution containing from about 5 v/o to about 30 v/o hydrochloric acid. As used herein, v/o means volume percentage. For palladium additions, the dissolved palladium salt is added to the tin-containing base solution so that palladium is added at a rate of less than about 10 mg/min per liter of solution. When a palladium salt addition is made, the palladium concentration in the final coating solution should be in the range of from about 5 ppm to about 10,000 ppm. For solutions such as LT-26, the palladium concentration in the final coating solution is preferably in the range of from about 20 ppm to about 30 ppm. When a silver salt or one of the other aforementioned metal salts are added, they should be added to the tin-containing base solution in an amount sufficient to obtain the aforementioned concentration ranges in the final coating solution.

After the tin coating solution has been prepared, any suitable technique known in the art may be used to form the tin or tin containing coating on the substrate material. One of the main advantages of the present invention is that the coating solutions formed thereby may be used in conjunction with any of the three widely used methods for coating a substrate material with tin or a tin containing material—namely, (1) electroless plating, (2) electrodeposition, and (3) immersion. The choice of which coating method to employ is a function of the type of substrate to be coated and the relative advantages and disadvantages between the methods. Coatings formed in accordance with the present invention generally consist essentially of from about 0.1 w/o to about 20 w/o palladium and the balance essentially tin. Preferably, the coating consists essentially of from about 0.5 w/o to about 10 w/o palladium and the balance essentially tin. Most preferably, the coating consists essentially of from about 1 w/o to about 5 w/o palladium and the balance essentially tin. As used herein, w/o means weight percentage. Where the tin coating is applied to a copper base substrate, the coating may also contain copper and/or copper-tin intermetallic compounds. Similarly, where the base solution and the coating solution contain lead or silver, the coating may also contain lead or silver.

It has been discovered that the coatings produced from the solutions of the present invention are characterized by a relatively fine grain structure and a relatively smooth surface. Such a coating is highly desirable from the standpoint of avoiding the problems associated with porous type coatings. In addition, the coatings formed by the solutions of the present invention do not adversely affect solderability or reflow properties—something very desirable when the coated article is to be used in electronic and electrical applications where it is to be soldered or bonded to some other component.

The coating solutions of the present invention have particular utility in forming solderable or reflowable tin coatings on copper or copper base alloy substrates such as circuit foil after formation of a desired circuit has been completed. It is desirable that the tin coating applied by the techniques of the present invention and thus the tin coating solution be substantially zinc-free when the coating is to be applied to copper or copper base alloy substrates for use in electrical and electronic applications. The coating solutions of the present invention may also be used to coat circuitry on non-conductive, flexible plastic substrates. Still another advantage of the present invention is that the coating solution does not have to be kept at any particular temperature during the coating process. It has been found to be desirable however to maintain the solution at a temperature between about room temperature and about 65° C.

While the particular coating technique employed to coat the substrate material is not significant from the standpoint of the present invention, it has been found to be desirable to establish a relative flow rate known as the mixing rate between the liquid solution being applied and the substrate to be coated. If there is no such relative flow rate, one could quickly exceed the supply of available salt addition to be applied to the substrate surface(s). Obviously, if no additive is applied to the surface coating(s), substantially no whisker resistance can be imparted to the coatings. It has been discovered that useful mixing rates are those in the range of from about 2 cm/sec to about 100 cm/sec. A preferred mixing rate is in the range of from about 5 cm/sec to about 30 cm/sec. Of course, the particular mechanism for establishing the mixing rate is dependent upon the particular technique being employed to coat the substrate material. Any appropriate mechanism known in the art may be used to establish the mixing rate for a particular coating technique.

Prior to the application of the above coating solutions, it is desirable, although not necessary, to clean the substrate material. The type of cleaning treatment employed is of course a function of the particular substrate composition and the type of contaminants to be removed. After cleaning, the substrate material may be rinsed to remove any residual chemicals and/or any loose particles on the substrate. After rinsing, the substrate may be dried if so desired. Any suitable technique known in the art may be employed to rinse and/or dry the substrate material.

After the tin or tin containing coating has been applied to the substrate material, the coated substrate may again be rinsed to remove any residual chemicals and loose particles and/or dried. Once again, any suitable rinsing and/or drying technique known in the art may be employed. For example, the substrate may be rinsed in hot water followed by a cold water rinse.

To demonstrate the present invention, the following examples were performed:

EXAMPLE I 50 ml. of TIN-POSIT by Shipley was doped with 0.07 grams of $PdCl_2$ powder. At 50° C., still noticeable insolubles were present in the solution. After settling of the insolubles, 10 ml. of the above solution was diluted by adding it to 60 ml. of fresh TIN-POSIT solution. This solution was then used for depositing tin on samples formed from copper alloy C11000.

The copper alloy samples were immersed in the solution for 10 minutes. Prior to being immersed in the solution, the samples were immersed in an aqueous 10 v/o sulfuric acid solution to activate the surfaces to be coated and then rinsed. While the samples were immersed in the coating solution, a mixing rate of 30 cm/sec was established. After being removed from the coating solution, the samples were rinsed first in hot water for 2 minutes and then in cold water for 2 minutes.

A grayish deposit of about 0.5 microns thickness was obtained on the samples. The deposits showed a very fine (1 micron or less) grain structure. The deposits were also darker than undoped tin deposits. Three weeks after immersion in the solution, no whisker growth was observed on the samples.

EXAMPLE II 10 ml. of the solution used to coat the samples in Example I was further diluted by adding it to 60 ml of a fresh TIN-POSIT solution. Copper alloy C11000 samples that had been cleaned in an aqueous sulfuric acid solution and thereafter rinsed were immersed in the coating solution for 10 minutes. The coating solution was kept at 50° C. and a mixing rate of 30 cm/sec was again established. After being removed from the coating solution, the samples were rinsed in hot water for 2 minutes and then in cold water for 2 minutes.

The tin deposits obtained from this solution were lighter by visual observation but still displayed a fine granular structure. Again, three weeks after immersion in the solution, the tin coated copper alloy C11000 samples showed no evidence of tin whisker growth.

EXAMPLE III 10 ml. of room temperature silver sulfate saturated water (0.7 gr $Ag_2SO_4$/100 gr $H_2O$) was added to 60 ml of TIN-POSIT solution. This mixture was used for tin deposition at 50° C. Again, copper alloy C11000 samples that had been cleaned in an aqueous sulfuric acid solution and rinsed were immersed in the mixture and a mixing rate of 30 cm/sec was established. After 12 minutes, a deposit was obtained. Upon removal from the solution, the samples were again rinsed in hot water for 2 minutes and then in cold water for 2 minutes.

The deposits obtained using this solution were similar to a tin deposit in coloration but were of finer grain structure and different crystallinity. After four weeks, these deposits showed no evidence of tin whisker growth.

All of the samples treated in accordance with the above Examples demonstrate wettability by solder comparable to that obtained by plain tin deposits.

EXAMPLE IV

For comparison purposes, copper alloy C1100 samples were immersed in an undoped TIN-POSIT solution for 10 minutes at 50° C. As before, the copper samples had been cleaned in an aqueous sulfuric acid solution and rinsed. After removal from the undoped solution, the copper samples were rinsed in hot water for 2 minutes and then in cold water for 2 minutes. A tin deposit about 0.5 micron in thickness was formed on each sample. Within 16 hours of the deposition process, 6-8 micron long tin whiskers were observed on the samples.

EXAMPLE V

A piece of flat electrodeposited copper foil, 1 inch by 1.5 inch, was bent into a semi-circular shape and tin plated in the curved condition in a one liter container filled with an immersion tin plating solution designated LT-26 and sold by Shipley. Plating was done for three minutes at a temperature of about 70° C. After plating was completed, the sample was cleaned, bent back into a flat condition and taped onto a glass slide. By this mechanism, compressive stresses were introduced into the plated layer causing the growth of tin whiskers.

For comparison purposes, a similar sample was plated under identical conditions but in an LT-26 solution containing 25 ppm palladium. The palladium was added by dissolving 41.7 mg of palladium chloride in 10 ml. of 20 v/o hydrochloric acid. The palladium chloride-hydrochloric acid solution was added to the LT-26 solution bath at an average rate of 1 ml/min.

The two samples were stored in air. After five days, whiskers were evident on the sample plated in the palladium-free solution (approximately 220 microns length of whiskers per square millimeter of surface area). No whiskers occurred on the sample plated in the solution containing palladium. After 55 days, there were approximately 940 microns/mm$^2$ of whiskers on the sample plated in the palladium-free solution versus approximately 18 microns/mm$^2$ of whiskers on the sample plated in the solution containing palladium.

While the tin coating may be formed from a saturated solution diluted in the base solution, similar high quality coatings may be formed by applying the saturated tin containing solution to the substrate. Again, any suitable coating method may be used to apply the saturated solution to the substrate.

The patents, articles and foreign patent publications set forth in the specification are intended to be incorporated by reference herein.

It is apparent that there has been provided in accordance with this invention whisker resistant tin coatings which fully satisfy the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications, and variations as fall within the spirit and broad scope of the appended claims.

What is claimed:

1. A method for inhibiting tin whisker growth on a substrate material having a tin containing coating, said method comprising:
   preparing a tin coating solution containing a metal salt selected from the group consisting of palladium salts, silver salts, nickel salts, iron salts, cadmium salts, platinum salts, gold salts, indium salts, ruthenium salts, and cobalt salts; and
   said preparing step comprising providing an initial tin containing solution and adding said metal salt to said initial solution in a concentration above the saturation point of the initial solution to form a metal salt saturated solution; and
   applying said tin coating solution to said substrate material.

2. The method of claim 1 further comprising:
   diluting said metal salt saturated solution by adding said metal salt saturated solution to an additional quantity of said initial solution, said diluted solution forming said tin coating solution.

3. The method of claim 2 wherein said salt adding step comprises:
   adding a sufficient amount of palladium salt to said initial solution so that said tin coating solution contains a concentration of palladium in the range of from about 5 ppm to about 10,000 ppm.

4. The method of claim 2 wherein said salt adding step comprises:

adding a sufficient amount of palladium salt to said initial solution so that said tin coating solution contains a concentration of palladium in the range of from about 20 ppm to about 1000 ppm.

5. The method of claim 2 wherein said metal salt adding step comprises:
adding a sufficient amount of a silver salt to said initial solution so that said tin coating solution contains silver in a concentration in the range of from about 50 ppm to about 50,000 ppm.

6. The method of claim 2 wherein said metal salt adding step comprises:
adding a sufficient amount of a silver salt to said initial solution so that said tin coating solution contains silver in a concentration in the range of from about 500 ppm to about 5000 ppm.

7. The method of claim 1 wherein said applying step comprises immersing said substrate material in said tin coating solution.

8. The method of claim 1 wherein said applying step comprises electrolessly depositing the tin containing coating from said tin coating solution onto said substrate material.

9. The method of claim 1 wherein said applying step comprises electrodepositing the tin containing coating from said tin coating solution onto said substrate material.

10. The method of claim 1 wherein said applying step comprises applying said coating solution to said substrate material at a mixing rate in the range of from about 2 cm/sec to about 100 cm/sec.

11. The method of claim 1 wherein said applying step comprises applying said coating solution to said substrate material at a mixing rate in the range of from about 5 cm/sec to about 30 cm/sec.

12. A tin coating solution for imparting tin whisker formation resistance to a substrate material coated with a tin containing material, said solution comprising a tin containing solution having a concentration of a palladium salt, the palladium being present in an amount greater than about 50 ppm.

13. The tin coating solution of claim 12 wherein said palladium concentration is in the range of from about 50 ppm to about 1000 ppm.

14. A composite structure for use in electrical and electronic applications comprising:
a metal or metal alloy substrate;
a whisker resistant tin coating on at least one surface of said substrate, said tin coating consisting essentially of from about 0.1 w/o to about 20 w/o palladium for inhibiting tin whisker growth and the balance essentially tin; and
said tin coating having an essentially smooth surface and a relatively fine grain structure of less than about 1 micron with said substrate being formed from copper or a copper base alloy.

15. A composite structure for use in electrical and electronic applications comprising:
a metal or metal alloy substrate; and
a whisker resistant tin coating on at least one surface of said substrate, said tin coating consisting of from about 0.1 w/o to about 20 w/o palladium for inhibiting tin whisker growth and the balance essentially tin.

16. The composite structure of claim 15 further comprising:
said coating consisting of from about 0.5 w/o to about 10 w/o palladium and the balance essentially tin.

17. The composite structure of claim 15 further comprising:
said coating consisting of from about 1 w/o to about 5 w/o palladium and the balance essentially tin.

18. The composite structure of claim 15 further comprising:
said substrate being formed from copper or a copper base alloy.

* * * * *